United States Patent [19]
Horninger

[11] 4,041,459
[45] Aug. 9, 1977

[54] INTEGRATED PROGRAMMABLE LOGIC ARRANGEMENT

[75] Inventor: Karlheinrich Horninger, Eglharting, Germany

[73] Assignee: Siemens Aktiengesellschaft, Berlin & Munich, Germany

[21] Appl. No.: 681,170

[22] Filed: Apr. 28, 1976

[30] Foreign Application Priority Data

Apr. 29, 1975 Germany .............................. 2519078

[51] Int. Cl.² ........................ G11C 8/02; G11C 11/40
[52] U.S. Cl. ..................... 340/166 R; 340/173 AM
[58] Field of Search ......... 340/166 R, 173 SP, 173 R, 340/173 AM; 235/150.5; 307/207; 328/92

[56] References Cited

U.S. PATENT DOCUMENTS

| | | |
|---|---|---|
| 3,895,360 | 7/1975 | Cricchi .......................... 340/173 AM |
| 3,924,243 | 12/1975 | Vermeulen .................... 340/173 AM |
| 3,936,811 | 2/1976 | Horninger ..................... 340/173 AM |
| 3,940,740 | 2/1976 | Coontz ........................... 340/166 R |

*Primary Examiner*—Donald J. Yusko
*Attorney, Agent, or Firm*—Hill, Gross, Simpson, Van Santen, Steadman, Chiara & Simpson

[57] ABSTRACT

An integrated programmable logic arrangement is provided into which a logic pattern can be electronically written, and out of which a logic pattern can be electronically read-out. The logic arrangement has an AND-matrix, an OR-matrix, switching transistors in the AND and OR matrices comprising $MI_1I_2S$ (metal-insulation 1-insulation 2-semiconductor) storage type transistors, and decoder means connected to the AND and OR matrices.

8 Claims, 6 Drawing Figures

INTEGRATED PROGRAMMABLE LOGIC ARRANGEMENT

BACKGROUND OF THE INVENTION

1. Field of the Invention

This invention relates to an integrated programmable logic arrangement (programmable logic array).

2. Description of the Prior Art

Logic arrangements of this type are generally known and are referred to in brief as PLA. For example, the publication of W. Carr & J. Mize: "MOS/LSI design and application", McGraw-Hill Book Co., New York, 1972, p. 229 to 258 describes such a logic arrangement, which basically comprises an AND-gate, an OR-gate, and of the associated drive- feedback- and output- circuits.

FIG. 1 is a block circuit diagram of a known arrangement of this type. Here, the AND-matrix is referenced 1 and the OR-matrix is referenced 2. The signals present at the inputs $E_1$ to $E_n$ of the AND-matrix 1 are logic-linked in the matrices 1 and 2. The result of this logic-link is present at the outputs $A_1$ to $A_n$ of the OR-matrix 2. Logic-linking signals are also present at the inputs $E_1'$ to $E_n'$ of the feed-back loop 3. In the feedback loop 3, the information is delayed by a specific length of time, so that when the next item of information is present at the inputs $E_1$ to $E_n$ of the AND-matrix 1, it can be logic-linked with the previous item of information present at the outputs $A_1'$ to $A_n'$ of the feedback loop. It is thus possible to effect logic functions with a time delay (so-called sequential logic) with the aid of programmable logic arrangements.

The AND-matrix 1 may consist of individual gates, each gate consisting in turn of parallel-connected switching transistors. In each case, one gate terminal of each switching transistor is connected to a control line. For example, in the AND-matrix 1, the switching transistors 14 and 17 are transistors of the first gate. Here the switching transistor 14 is connected to the control line 141 which in turn is connected to the input $E_1$. The switching transistor 17 is connected to the control line 171 which in turn is connected via the negator 19 to the input $E_2$. On one side, the switching transistors 14 and 17 are connected to ground via the line 131, and on the other side they are connected to the gate line 111. The supply voltage $U_{DD}$ is connected to the gate line 111 via the load transistor 11 which is connected as a load transistor.

Individual gates, such as the gate composed of the transistors 24 and 26 in the OR-matrix 2, are arranged in corresponding manner.

Further details of known programmable logic arrangements of this type are given in earlier U.S. Ser. No. 633,959 and U.S. Pat. No. 3,974,366 issued on Aug. 10, 1976 of the same assignee.

Known programmable logic arrangements of this type are programmed with the aid of a mask during production. This creates the disadvantage that after production has been completed, it is no longer possible to change the logic pattern.

SUMMARY OF THE INVENTION

An object of the present invention is to provide a programmable logic arrangement into which a logic pattern can be written-in electronically and out of which the logic pattern can be read-out electronically.

A principle advantage of the invention is the ability to write-in a logic pattern of the PLA which can be changed again by the user as frequently as desired. This is most advantageous for testing a specific circuit, and also where only small numbers of logic circuits are required.

The integrated programmable logic arrangement for this invention has AND and OR matrices having individual gates wherein each gate has a selector line, a base line and a control line. Switching transistors are provided at the AND and OR matrices intersection points formed by intersecting control lines and selector lines. Each of the switching transistors has a gate terminal connected to an intersecting control line, one end of a main current carrying portion connected to an intersecting selector line, and the other end being connected to a base line. Control lines of the OR matrix are connected via inverters to selector lines of the AND matrix. Switching transistors in the AND and OR matrices comprise $MI_1I_2S$ storage transistors. Decoder means for the production of a logic pattern in the AND and OR matrices are connected to both the AND and OR matrices. The switching transistors in the decoder and inverter means comprise $MI_1I_2S$ transistors which have no storage capability.

DESCRIPTION OF THE PREFERRED EMBODIMENTS

Figure 2:
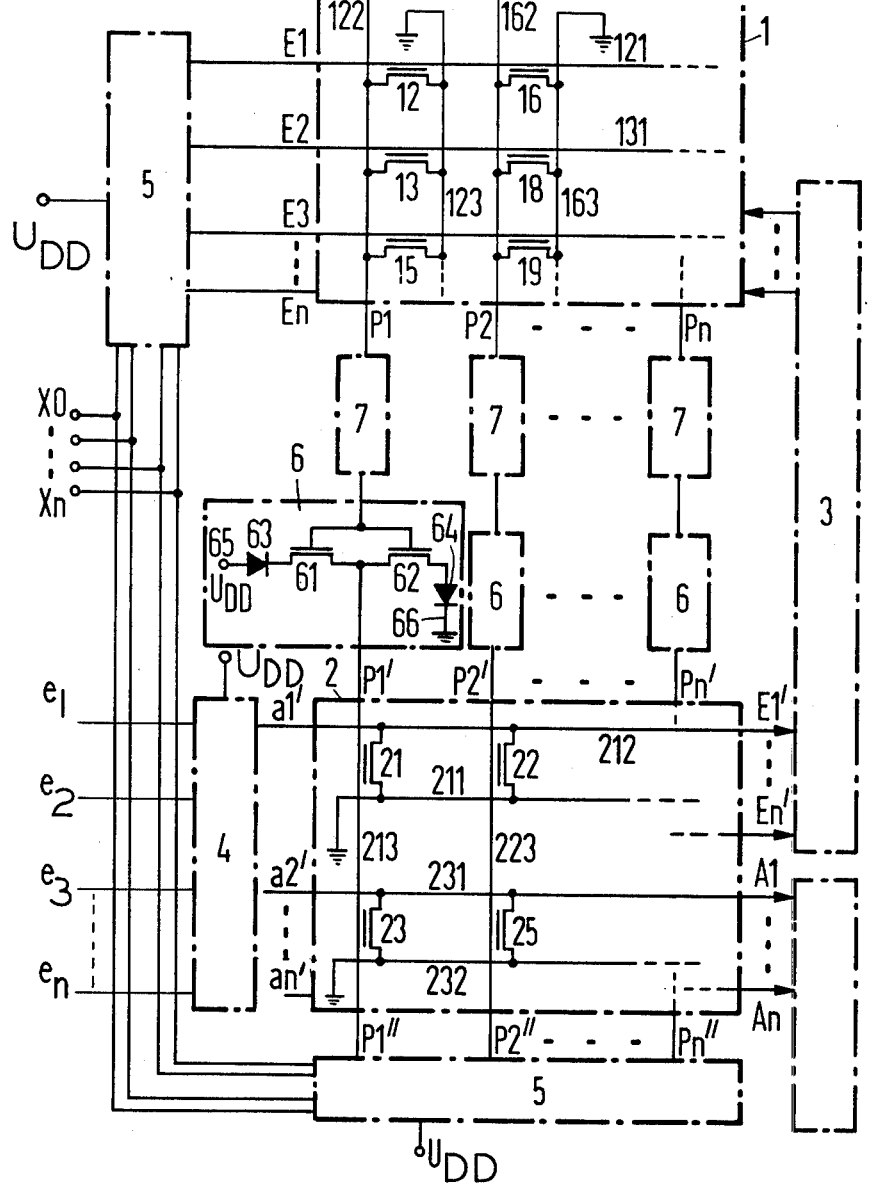
FIG. 2 is a block circuit diagram of a programmable logic arrangement in accordance with the invention.

FIG. 2 shows the block circuit diagram of a programmable logic arrangement in accordance with the invention in which $MI_1I_2S$-storage transistors are used. The $MI_1I_2S$-transistors (metal-insulation 1-insulation 2-semiconductor) are preferably MNOS-(metal-nitride-oxide-semiconductor) or MAOS-(metal-aluminum-oxide-semiconductor)transistors. In addition to the drive circuits of known programmable logic arrangements, additional drive circuits 4, 4' and 5, 5' are provided.

Figure 1:
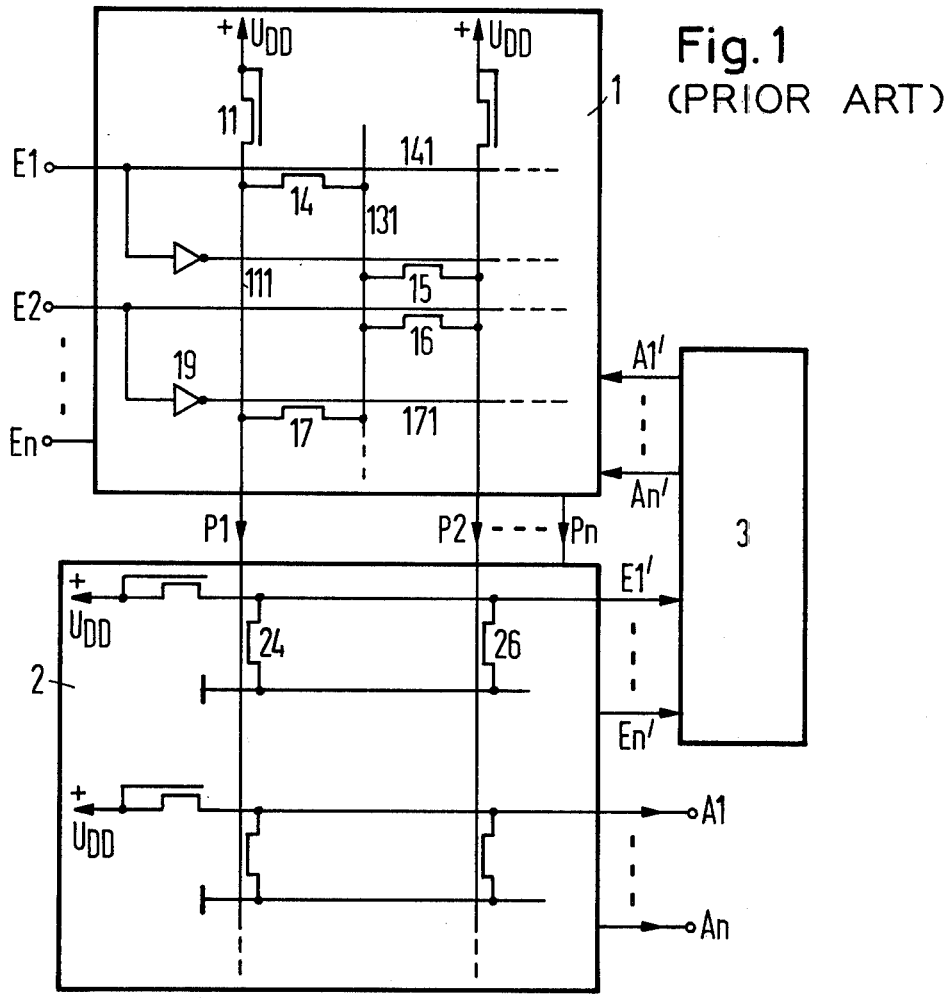
FIG. 1 is a block circuit diagram of a known programmable logic arrangement.

In accordance with the invention, $MI_1I_2S$ transistors are provided in the AND-matrix 1 and in the OR-matrix 2. For the sake of simplicity, only the inputs $E_1$ to $E_3$ of the inputs $E_1$ to $E_n$ of FIG. 2 have been represented at the AND-matrix 1. Input inverters 19 (in FIG. 1) are connected to the inputs $E_1$ to $E_n$ in known manner. The switching transistors 12, 13 and 15 belong to a first gate, whereas the switching transistors 16, 18 and 19 belong to a second gate. Preferably one $MI_1I_2S$ storage transistor is provided for each input $E_1$ to $E_n$ in each gate. In accordance with the invention, these transistors are preferably MNOS- or MAOS storage transistors. The gate terminals of the switching transistor 12 of the first gate, of the switching transistor 16 of the second gate, and of further corresponding switching transistors (not shown) of further gates are connected to the control line 121, which in turn is connected to the input $E_1$. On one side of the main current carrying portion, each switching transistor is connected to one selector or output line of a gate. For example, the switching transistors 12, 13, 15 etc. of the first gate are connected to the selector or output line 122, and the switching transistors 16, 18, 19, etc. of the second gate are connected to the selector or output line 162. On the other side of the main current carrying portion, each switching transistor is connected to a base line. For example, the transistors 12, 13, 15 etc. of the first gate are connected to the base line 123, and the switching transistors 16, 18, 19 etc. of the second gate are connected to the base line 163. The drain terminals of these switching transistors of a gate are preferably connected to ground through the base line. The output lines 122, 162 etc. lead at one end of the AND-matrix 1 to the decoder arrangement 4 and on the other end to the intermediate inverters 6 and 7. Here, the decoder arrangement 4 consists, for example, of a serial/in-parallel/out shift register. Both the function of the decoder arrangement 4 and the function of the intermediate inverter 6 will be explained in detail later in the description. To prevent the signals from being inverted, preferably a conventional C/MOS-inverter 7 (inverter comprised of complementary transistors) is arranged between the inverter 6 and each output line 122, 162 etc.

Each output line $P_1$ to $P_n$ of each gate is connected via an intermediate inverter 6 to a control line $P_1'$ to $P_n'$ of the OR-matrix 2. For example, the selector or output line 122, which forms the output $P_1$ of the AND-matrix 1 is connected via the inverter, composed of the transistors 61 and 62, to the input $P_1'$ of the OR-matrix 2. This input $P_1'$ of the OR-matrix 2 is connected to the control line 213. Correspondingly, the selector or output line 162 of the second gate of the AND-matrix 1, which is connected to the output $P_2$ of the matrix 1, is connected via an intermediate inverter 6 to the input $P_2'$ of the OR-matrix 2. The input $P_2'$ of the OR-matrix 2 is connected to the control line 223. Correspondingly, all the output lines of all the other gates in the AND-matrix 1 not shown in FIG. 2 are connected to all the other control lines in the OR-matrix 2, not shown in the FIG. 2.

In the OR-matrix 2, a first gate consists, for example of the switching transistors 21, 22 etc. and a second gate consists of the switching transistors 23, 25 etc.

Each of the inputs $P_1'$ to $P_n'$ in each gate is preferably assigned a $MI_1I_2S$ switching transistor. Each gate terminal of the switching transistor comprising a gate is connected to a control line. In accordance with the invention, the switching transistors of the individual gates are $MI_1I_2S$ transistors, preferably MNOS- or MAOS transistors of the p-channel type or n-channel type. For example, the transistor 21 of the first gate and the transistor 23 of the second gate are connected to the control line 213. Correspondingly, the transistor 22 of the first gate and the transistor 25 of the second gate are connected to the control line 223. On one side the switching transistors of a matrix are connected to a base line, and on the other side to an output line. For example, the transistors 21, 22 etc. of the first gate are connected on one side to the base line 211 and on the other side to the output line 212. The transistors 23, 25 etc. of the second gate are connected on one side to the base line 232 and on the other side to the output line 231. The output lines 212, 231 etc. are at one end connected to the decoder arrangement 4 and at the other end are connected to one of the outputs $E_1'$ to $E_n'$ or $A_1$ to $A_n$.

In accordance with the invention, in order to write-in the logic pattern into the AND- or OR-matrix via a decoder 5 of 5', suitable gate pulses are connected to selected gate lines of the switching transistors of the matrices 1 and 2. The information itself is present on the output lines of the AND- or OR-matrix and is connected via a decoder arrangement 4 or 4' to these output lines. In this way the logic pattern is written into the AND-matrix or the OR-matrix such that in accordance with the desired pattern, individual transistors of the matrices 1 or 2 are operated by control via the gate terminals by the decoder 5 or 5' and by simultaneous control via the output lines by the decoder arrangement 4 or 4'. In this way the threshold voltage of these transistors, operated in the above manner, is changed.

Figure 3:
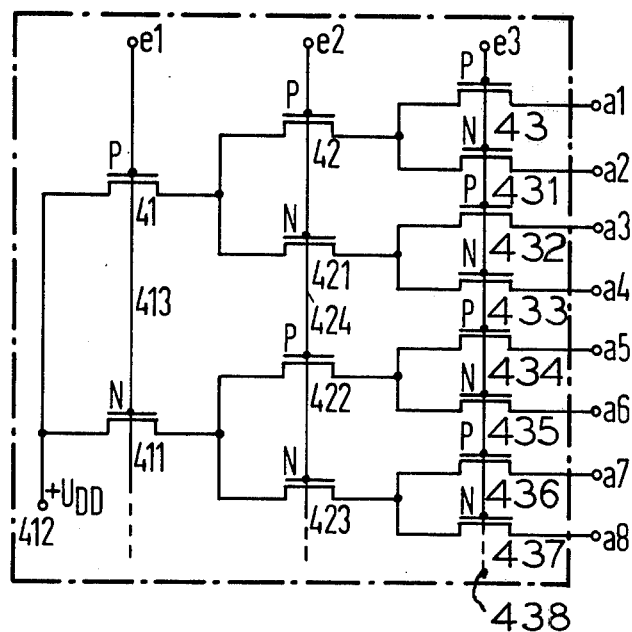
FIG. 3 is the circuit diagram of a decoder.

Decoders constructed as illustrated in FIG. 3 may be used for the decoder arrangements 4, 4' and 5, 5'. Decoders of this type, which are so-called tree decoders in the C/MOS technique, are described in detail by W. Carr and J. Mize: "MOS/LSI Design and Application", McGraw-Hill Book Co., 1972, p. 208 to 209. Each output $a_1, a_2 \ldots$ to $a_n$ of such a decoder 4 is connected to a selector or output line 122, 162 etc. of the AND- matrix 1, whereas the outputs of another decoder 4' are connected correspondingly to the output lines 212, 231 etc. of the OR-matrix 2. Correspondingly, the outputs of the decoder 5 and 5' with the control lines $E_1$ to $E_n$ and $P_1''$ to $P_n''$ are connected to the control lines 121, 131 etc. of the AND-matrix 1 and 213, 233 etc. of the OR-matrix 2. Here the decoders are constructed in such manner that, commencing from the terminal 412, to which the power supply voltage $U_{DD}$ (which functions to provide a write-in voltage $U_s$) is connected, the source- and drain terminals of the transistor 41 and 411 are connected. The drain- or source terminal of the transistor 41 or 411 is, in each case, connected to the source- or drain terminal of the transistor 42, 421, 422, 423. Similarly, the source or drain terminal of the transistor 42 is connected to the source or drain terminal of the transistor 43 and the source or drain terminal of the transistor 431. The source or drain terminal of the transistor 421 is connected to the source or drain terminal of the transistor 432 and the source or drain terminal of the transistor 433. The source or drain terminal of the transistor 422 is connected to the source or drain terminal of the transistor 434 and the source or drain terminal of the transistor 435. The source or drain terminal of the transistor 423 is connected to the source or drain terminal of the transistor 436 and the source or drain terminal of the transistor 437. The free terminals of the transistors 43 and 431 to 437 form the terminals $a_1$ to $a_8$ of the decoder. The transistors 41 and 411 can be commonly operated via the gate line 413. The transistors 42, 421, 422 and 423 can be commonly operated via the gate line 424. The transistors 43, 431 to 437 can be commonly operated via the gate line 438. The transistors 41, 42, 422, 43, 432, 434 and 436 are preferably P-channel field effect transistors, whereas the remainder of the transistors are preferably N-channel transistors. By a suitable selection of the voltages across the lines 413, 421 and 438, the power supply voltage $\pm U_{DD}$ can be connected to each of the outputs $a_1$ to $a_8$ to provide a write-in voltage $\pm U_s$. For example, the voltage $U_s$ is present at the output $a_6$ when the line 413 carries $+U_s$, the line 424 carres 0 V and the line 438 carries $+U_s$ volts and with $+U_s$ on line 412. Then all the other outputs are blocked.

Figure 4:
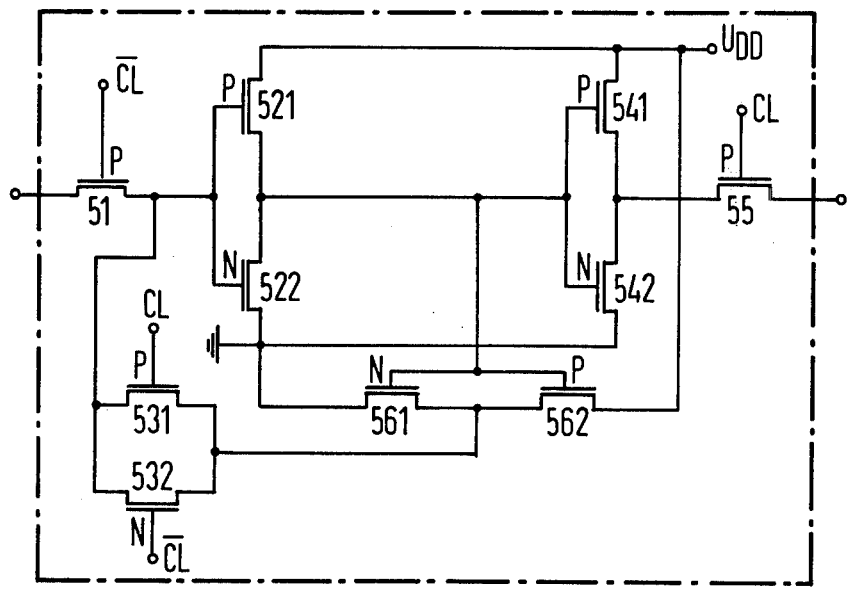
FIG. 4 shows a circuit diagram of a quasi-dynamic shift register.

Instead of the above-described decoders, when the number of programming processes is to be kept small, the decoders 4, 4' can also be in the form of serial-in/parallel-out shift registers. In this case, the write voltage to the gate of the MI$_1$I$_2$S transistors, is not connected until the information for the logic pattern of a whole row (AND-matrix 1) or a whole column (OR-matrix) is present at the output of the shift register (and thus also on the source lines of the MNOS-transistors). In order to keep the area of the shift register small, it can also be constructed as a quasi-static shift register. The publication by W. Carr and J. Mize: "MOS/LSI Design and Application", McGraw-Hill Book Co., New York, 1972, p. 229 to 258 described a quasi-static shift register of this type. FIG. 4 represents a quasi-static shift register using C/MOS (complementary) technique.

Figure 5:
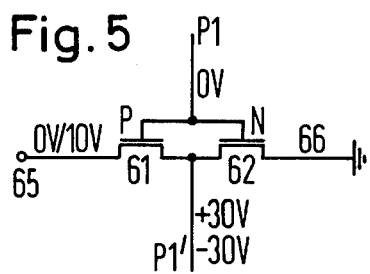
FIG. 5 shows the voltages occurring across the inverter on the connection of a positive or negative write-in voltage.
Figure 6:
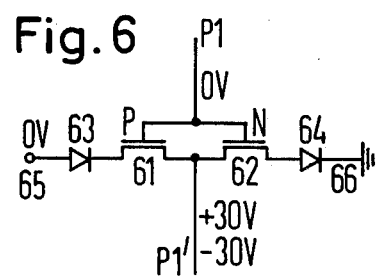
FIG. 6 shows an inverter with protective diodes in accordance with the invention.

In the construction of a programmable logic arrangement with MNOS transistors a problem occurs since the gate lines to which the high positive or negative write-in voltage pulse is connected are at the same time also connected to the output of an inverter 6 or 7. In the event that C/MOS-inverters are used, the voltages given in FIG. 5 are connected to the inverter. If, for example, the gate line of the inverter 6, namely the output line 122, carries 0 V, and if +30 V is present at the output of the inverter, the write-in voltage is short-circuited via the conductive P-channel transistor 61, whereas the N-channel transistor remains blocked. If a write-in voltage of −30 V is connected, the N-channel transistor goes conductive and short-circuits the write-in voltage to ground, whereas the P-channel transistor remains blocked. To prevent the write-in voltage from being short-circuited via the inverter-, in accordance with the invention a diode 63, 64 is inserted into the bias voltage supply line and into the ground line, as illustrated in FIG. 6, in such manner that the function of the inverter is unchanged during the normal operation of the programmable logic arrangement. The diodes 63 and 64 prevent the write-in voltage from being short-circuited to ground when the N-channel transistor and P-channel transistor is conductive. During the normal operation of the programmable logic arrangement, the line 65 is again connected to the positive supply voltage +U$_{DD}$. In this case the diodes 63 and 64 are biased in the forward direction and do not disturb the operation.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An integrated, programmable logic arrangement comprising:
   a. an AND-matrix and an OR-matrix, each having individual gates, each gate having a selector line, a base line, and a control line;
   b. switching transistors being provided at AND-matrix intersection points, each point being formed by an intersecting control line and selector line, each of said switching transistors having a gate terminal connected to the intersecting control line, one end of the switching transistor being connected to the intersecting selector line, and the other end being connected to a base line connected to a reference potential;
   c. switching transistors being provided at OR-matrix intersection points, each point being formed by an intersecting control line and selector line, each of said switching transistors having a gate terminal connected to the intersecting control line, one end of the switching transistor being connected to the intersecting selector line, and the other end being connected to a base line connected to a reference potential;
   d. each control line of the OR-matrix being connected via an inverter to a selector line of the AND-matrix;
   e. said switching transistors in the AND- and OR-matrices comprising MI$_1$I$_2$S (metal-insulation 1-insulation 2-semiconductor) storage transistors; and
   f. decoder means for the production of a logic pattern in the AND and OR-matrices comprising,
      1. a decoder having outputs connected to each control line of the AND-matrix, a decoder having outputs connected to each control line of the OR-matrix, said decoders having inputs for writing in a logic pattern, and
      2. a decoder arrangement having outputs connected to each selector line of the AND-matrix, a decoder arrangement having outputs connected to each selector line of the OR-matrix, said decoder arrangements having inputs for items of information.

2. The arrangement of claim 1 in which each inverter has two series-connected, complementary P and N channel field effect transistors, the gate terminals of said two transistors being connected to one another and forming an input of the inverter, and where the point at which the two transistors are connected in series forms the output of the inverter, that a protective diode is arranged between the other terminal of one transistor and a supply voltage potential, and a protective diode is arranged between the other terminal of the other transistor and the reference potential, whereby the protective diodes are connected in such manner that a write-in voltage is prevented from being short-circuited to earth when the N-channel transistor and P-channel-transistor are conductive.

3. The arrangement of claim 1 in which said decoder and decoder arrangements are formed as tree decoders having a plurality of parallel control lines, each control line having P and N channel transistor pairs, each pair having commonly connected gates by one of said control lines, outputs from said decoder being taken from transistor pairs in one of said control lines.

4. The arrangement of claim 1 in which that serial-in/parallel-out shift registers are provided as said decoders.

5. The arrangement of claim 1 in which MNOS-(metal-nitride-oxide-substrate) or MAOS-(metal-aluminum-oxide-substrate) transistors are provided as said MI$_1$I$_2$S storage transistors.

6. The arrangement of claim 1 in which a feedback means is provided between the AND and OR matrices.

7. The arrangement of claim 1 in which control lines of one of said decoders connect to control lines of the other of said decoders, a logic pattern to be written-in being placed on said control lines.

8. The arrangement of claim 1 in which said decoder means are connected to a supply voltage.

* * * * *